(12) United States Patent
Choi et al.

(10) Patent No.: US 9,202,950 B2
(45) Date of Patent: Dec. 1, 2015

(54) IMAGE SENSOR HAVING 3D PHOTOELECTRIC CONVERSION DEVICE

(71) Applicant: SK hynix Inc., Gyeonggi-do (KR)

(72) Inventors: Chung-Seok Choi, Gyeonggi-do (KR); Jong-Chae Kim, Gyeonggi-do (KR); Do-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/071,244

(22) Filed: Nov. 4, 2013

(65) Prior Publication Data
US 2015/0008553 A1  Jan. 8, 2015

(30) Foreign Application Priority Data
Jul. 3, 2013  (KR) .................. 10-2013-0077771

(51) Int. Cl.
*H01L 27/146* (2006.01)
*H01L 31/0232* (2014.01)

(52) U.S. Cl.
CPC ........ *H01L 31/0232* (2013.01); *H01L 27/1464* (2013.01); *H01L 27/14621* (2013.01)

(58) Field of Classification Search
None
See application file for complete search history.

(56) References Cited

U.S. PATENT DOCUMENTS

| | | | |
|---|---|---|---|
| 6,329,679 | B1 | 12/2001 | Park |
| 2007/0152250 | A1* | 7/2007 | Kim .............................. 257/292 |
| 2008/0048283 | A1 | 2/2008 | Han |
| 2010/0109060 | A1* | 5/2010 | Mao et al. .................... 257/292 |
| 2010/0117126 | A1 | 5/2010 | Takahashi |

FOREIGN PATENT DOCUMENTS

| | | |
|---|---|---|
| KR | 1020030001116 | 1/2003 |
| KR | 1020050039167 | 4/2005 |
| KR | 100660714 | 12/2006 |
| KR | 100746462 | 8/2007 |
| KR | 100982620 | 9/2010 |

\* cited by examiner

*Primary Examiner* — Johannes P Mondt
(74) *Attorney, Agent, or Firm* — IP & T Group LLP

(57) ABSTRACT

An image sensor includes a transfer gate formed over a substrate including front and back sides, a photoelectric conversion area formed in the substrate on one side of the transfer gate, a trench formed in the photoelectric conversion area and having a trench entrance located on the back side of the substrate, and a color filter formed over the backside of the substrate.

16 Claims, 15 Drawing Sheets

(A)

(B)

(C)

(D)

(E)

(F)

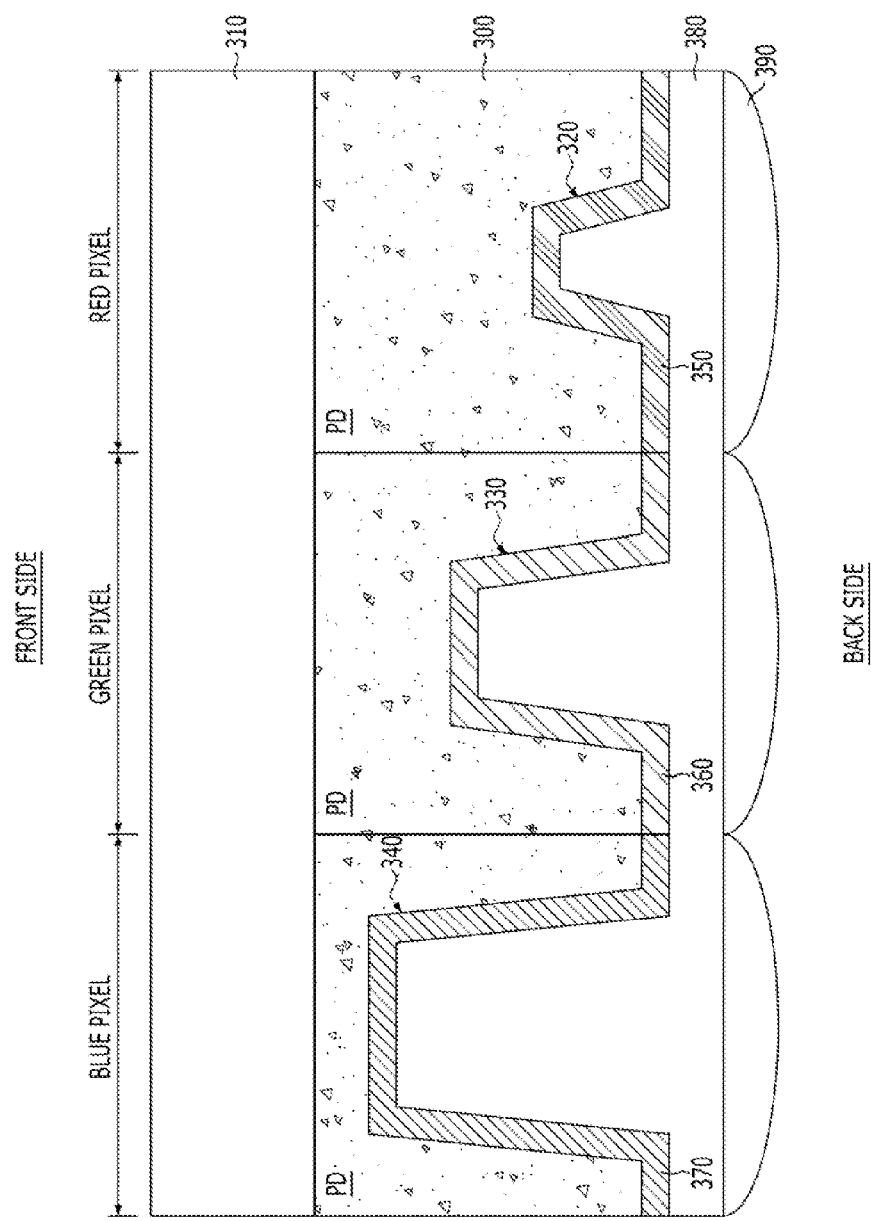

IMAGE SENSOR HAVING 3D PHOTOELECTRIC CONVERSION DEVICE

CROSS-REFERENCE TO RELATED APPLICATIONS

The present application claims priority of Korean Patent Application No. 10-2013-0077771, filed on Jul. 3, 2013, which is incorporated herein by reference in its entirety.

BACKGROUND

1. Field

Exemplary embodiments of the present invention relate to a semiconductor device, and more particularly, to an image sensor.

2. Description of the Related Art

Generally, an image sensor is a device that converts an optical image into an electric signal. The image sensor includes a plurality of pixels arranged in 2-dimension. Recently, as the number of pixels formed in a limited area is increased, a pixel area for each pixel is decreased. As the pixel area is decreased, light sensitivity of the image sensor may be degraded and a signal to noise ratio (SNR) may increase. Thus, the device characteristics may be deteriorated.

SUMMARY

An embodiment of the present invention is directed to an image sensor that may prevent deterioration of the device characteristics due to decrease of pixel area.

In accordance with an embodiment of the present invention, an image sensor includes a transfer gate formed over a substrate including front and back sides, a photoelectric conversion area formed in the substrate on one side of the transfer gate, a trench formed in the photoelectric conversion area and having a trench entrance located on the back side of the substrate, and a color filter formed over the back side of the substrate.

In accordance with another embodiment of the present invention, an image sensor includes a substrate including a first pixel and a second pixel, wherein the first pixel includes a first filter for filtering a visible light having a first wavelength band, and the second pixel includes a second filter for filtering a visible light having a second wavelength band, a photoelectric conversion area corresponding to the first pixel and the second pixel formed in the substrate, a first trench formed in the photoelectric conversion area of the first pixel, and a second trench formed in the photoelectric conversion area of the second pixel, and the second trench having a deeper depth than the first trench.

In accordance with yet another embodiment of the present invention, an image sensor includes a substrate including a visible light pixel and a non-visible light pixel, a photoelectric conversion area corresponding to the visible light pixel and the non-visible light pixel formed in the substrate, a trench formed in the photoelectric conversion area of the visible light pixel, wherein a depth of the trench is decreased as the wavelength of incident light incidence to the photoelectric conversion area is increased, and a plurality of color filters corresponding to the visible and non-visible light pixels formed over the substrate.

BRIEF DESCRIPTION OF THE DRAWINGS

FIGS. 8A to 8C are diagrams illustrating a unit pixel group included in the pixel array of the image sensor of FIG. 7, in accordance with a first embodiment of the present invention.

DETAILED DESCRIPTION

Figure 1:
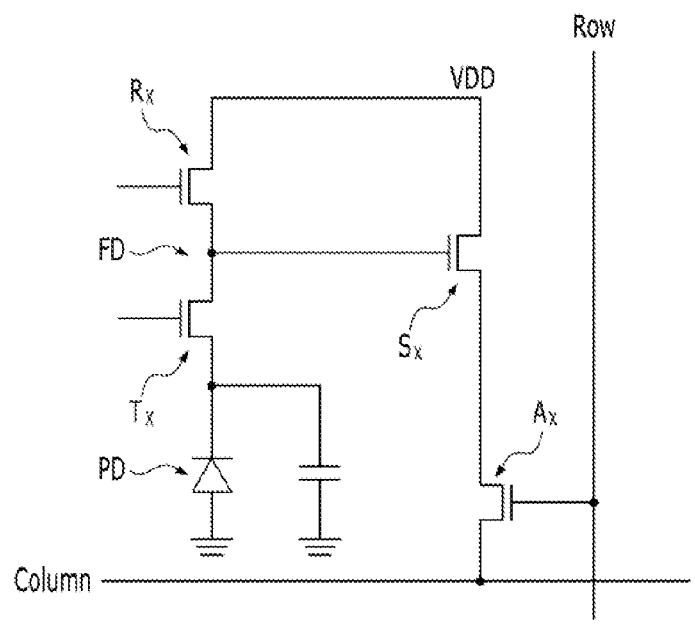
FIG. 1 is an equivalent circuit diagram illustrating an image sensor in accordance with an embodiment of the present invention and a general image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

According to the following embodiments of the present invention, although the pixel area is decreased due to increase of the number of pixels formed in a limited area in an image sensor having 2D arranged pixels, degradation in light sensitivity of the image sensor and any increase in a signal to noise ratio (SNR) may be prevented. In the embodiments of the present invention, the image sensor may increase a photo-detecting area of a photoelectric conversion area in a limited pixel area and prevent generation of photocharges, which may generate noise in the photoelectric conversion area. By forming trenches surrounding the photoelectric conversion area in a substrate having the photoelectric conversion area, the image sensor may increase the photo-detecting area of the photoelectric conversion area in the limited pixel area. Depth of the trench is controlled for each color separated incident light, so the image sensor may prevent generation of photocharges, which may generate noise in the photoelectric conversion area.

The image sensor is classified into a charge-coupled device type (CCD type) and a complementary metal oxide semiconductor type (CMOS type). The CMOS type image sensor uses a front-side illumination (FSI) method and back-side illumination (BSI) method. Recently, the image sensor using the BSI method is studied due to its superior characteristics. Hereinafter, the image sensor using the BSI method is exemplary described for convenience.

FIG. 1 is an equivalent circuit diagram of an image sensor in accordance with an embodiment of the present invention and a general image sensor.

Referring to FIG. 1, in the image sensor in accordance with an embodiment of the present invention and a general image sensor, each pixel includes a photoelectric conversion area (PD), a transfer transistor (Tx), a selection transistor (Sx), a reset transistor (Rx) and an access transistor (Ax).

The photoelectric conversion area (PD) may include a plurality of photoelectric conversion units (not shown) which are vertically overlapped. Each photoelectric conversion unit may include photo diode having an N-type impurity region and a P-type impurity region. A transfer gate of the transfer transistor (Tx) may be extended into the substrate. That is, the transfer gate may be a recess gate, a saddle-fin gate, or a buried gate. A drain of the transfer gate may be understood as a floating diffusion region (FD). The floating diffusion region (FD) may be a source of the reset transistor (Rx). The floating diffusion region (FD) is electrically coupled to a selection gate of the selection transistor (Sx). The selection transistor (Sx) and the reset transistor (Rx) are coupled in a row. The selection transistor (Sx) may be coupled to the access transistor (Ax). The reset transistor (Rx), the selection transistor (Sx) and the access transistor (Ax) may be shared by neighboring pixels, and thus, degree of the integration may be improved.

Hereinafter, operations of the image sensor will be described.

While incident light is blocked out, a power voltage (VDD) is supplied to a drain of the reset transistor (Rx) and a drain of the selection transistor (Sx), and charges are released in the floating diffusion region (FD). The reset transistor (Rx) is turned off (OFF) and the light is incident to the photoelectric conversion area (PD), photocharges, i.e., electron-hole pairs, are generated in the photoelectric conversion area (PD). The generated holes are moved to the P-type impurity region and accumulated and the generated electrons are moved to the N-type impurity region and accumulated. With the transfer transistor (Tx) turned on (ON), accumulated charges—electrons and holes—transfer into the floating diffusion region (FD) and accumulated. As the gate bias of the selection transistor (Sx) is changed based on the amount of the charges, electric potential of the source of the selection transistor (Sx) is changed. The access transistor (Ax) is turned on (ON), and a column line reads the signal due to the charges.

Hereinafter, the cause of the degradation of light sensitivity and an increase in signal to noise ratio (SNR) due to the decrease of the pixel area is described in detail.

Figure 2:
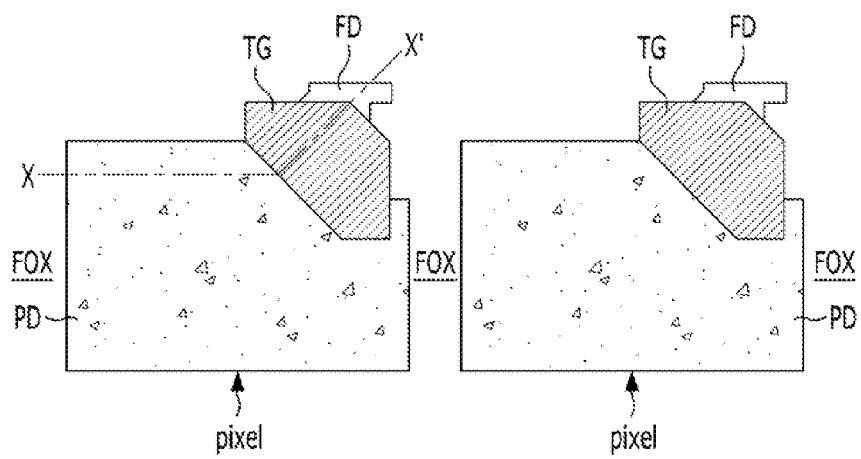
FIG. 2 is a plan view illustrating the image sensor in accordance with an embodiment of the present invention and the general image sensor.
Figure 3:
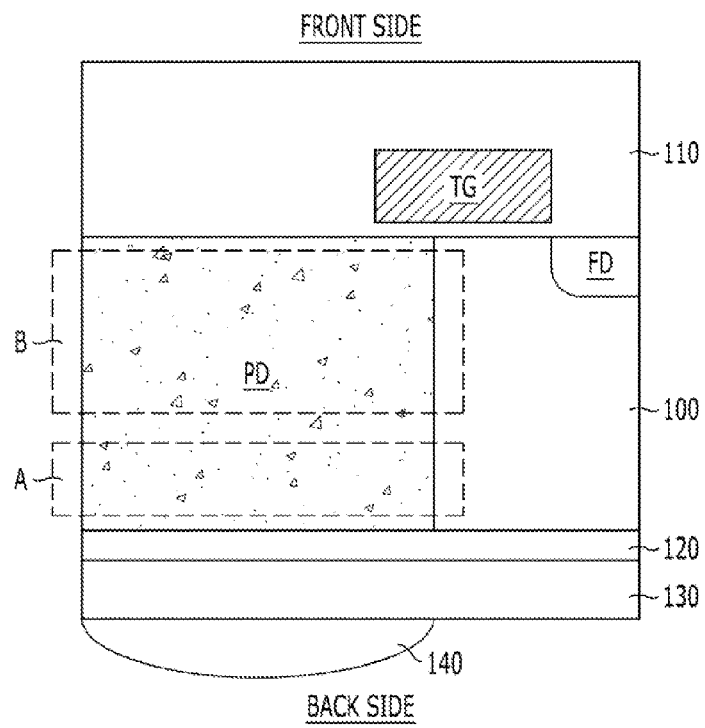
FIG. 3 is a cross-sectional view illustrating the general image sensor taken along line X-X' of the general image sensor of FIG. 2.

FIG. 2 is a plan view of the image sensor in accordance with an embodiment of the present invention and the general image sensor. FIG. 3 is a cross-sectional view of the general image sensor taken along line X-X' of the general image sensor of FIG. 2.

Referring to FIGS. 2 and 3, the pixels are arranged in 2D, and each of the pixels is isolated by a device isolation structure (FOX). The general image sensor includes a substrate 100, a transfer gate (TG), an interlayer insulation layer 110, a floating diffusion region (FD), a photoelectric conversion area (PD), a color filter 120, an overcoat 130, and a microlens 140.

The transfer gate (TG) is formed over a front side of the substrate 100. The interlayer insulation layer 110 is formed over the substrate 100, and plurality of transistors (not shown) and multilayer metal lines (not shown) are included therein. The floating diffusion region (FD) is formed in the substrate 100 on one side of the transfer gate (TG). The photoelectric conversion area (PD) is formed in the substrate 100 on another side of the transfer gate (TG). The color filter 120 is formed over the back side of the substrate 100. The overcoat 130 is formed over the color filter 120. The microlens 140 is formed over the overcoat 130, corresponding to the photoelectric conversion area (PD).

When the pixel area is decreased, the photo-detecting area of the photoelectric conversion area (PD) is decreased. As the photo-detecting area of the photoelectric conversion area (PD) decreases, the level of the photocharge generated is decreased, and thus, the amount of the photocharge moved from the photoelectric conversion area (PD) into the floating diffusion area (FD) and accumulated in the floating diffusion area (FD) is decreased. That is, the photo-detecting area of the photoelectric conversion area (PD) is decreased due to a decrease in the pixel area, and thus, the light sensitivity of the image sensor degrades due to the decrease in the accumulated amount of the photocharge.

The general image sensor includes the pixels having the same structure. Specifically, it is not considered that the absorption depth of the color separated incident light, e.g., an incident light passed through the color filter 120, and all pixels have the same shape. For example, the color filter 120 may be a blue filter, and the substrate 100 may be a silicon substrate. The color separated incident light, e.g., a blue incident light, is absorbed in an adjacent region (shown as 'A' in FIG. 3) toward the back side of the substrate 100, and photocharges operating as signal are generated. Since the blue incident light absorbed in a deeper area (shown as 'B' in FIG. 3) than the adjacent region A toward the back side of the substrate 100, photocharges operating as noise are generated. Therefore, a signal to noise ratio (SNR) of the image sensor is increased.

While the level of the photocharges generated is decreased due to the decrease in the photo-detecting area of the photoelectric conversion area (PD), the generation of the photocharges operating as noise causes the larger degradation of the light sensitivity and the decrease in the signal to noise ratio (SNR) of the image sensor.

Hereinafter, the image sensor increasing the photo-detecting area of the photoelectric conversion area (PD) in the limited pixel layer and preventing the generation of the photocharges operating as noise in the photoelectric conversion area (PD) will be described in detail.

Figure 4A:
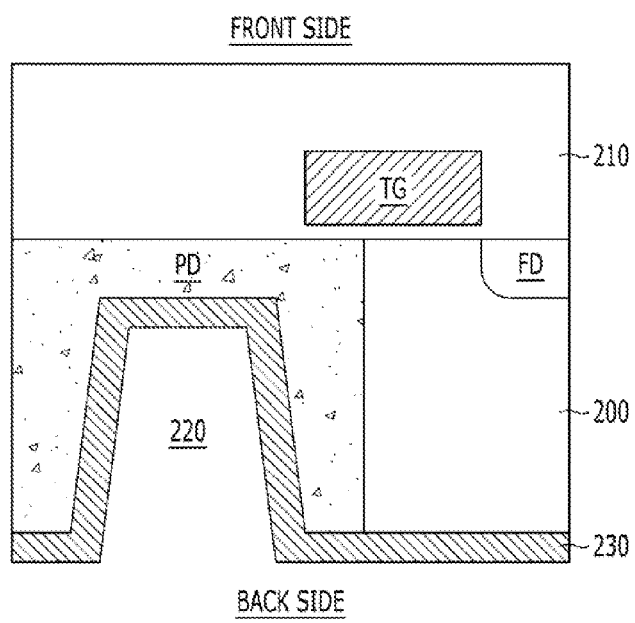
FIG. 4A is a cross-sectional view illustrating the image sensor in accordance with an embodiment of the present invention.
Figure 4B:
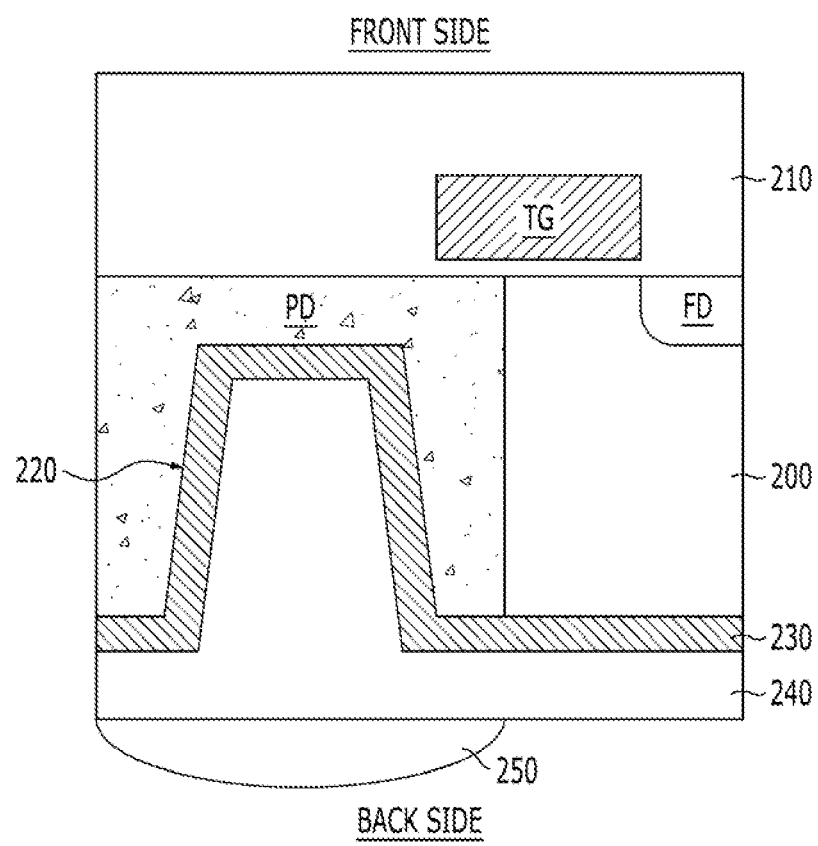
FIG. 4B is a cross-sectional view illustrating the image sensor in accordance with an embodiment of the present invention.

FIG. 4A is a cross-sectional view illustrating the image sensor in accordance with a first embodiment of the present invention. FIG. 4B is a cross-sectional view illustrating the image sensor in accordance with a second embodiment of the present invention. FIGS. 4A and 4B are cross-sectional views of the image sensor taken along line X-X' of the image sensor of FIG. 2.

Referring to FIGS. 4A and 4B, the image sensor, in accordance with the embodiments of the present invention, includes a substrate 200, a transfer gate (TG), an interlayer insulation layer 210, a floating diffusion region (FD), a photoelectric conversion area (PD), a trench 220, and a color filter 230 (shown in FIG. 4A). The image sensor further includes an overcoat 240, and a microlens 250 (shown in FIG. 4B).

The transfer gate (TG) is formed over a front side of the substrate 200. The interlayer insulation layer 210 is formed over the substrate 200, and a plurality of transistors (not shown) and multilayer metal lines (not shown) are formed therein. The floating diffusion region (FD) is formed in the substrate 200 on one side of the transfer gate (TG). The photoelectric conversion area (PD) is formed in the substrate 200 on another side of the transfer gate (TG). The trench 220 is formed in the photoelectric conversion area (PD) and the entrance of the trench is located on the back side of the substrate 200. The color filter 230 is formed over the back side of the substrate 200 including the trench 220. The overcoat 240 is formed over the back side of the substrate including the color filter 230. The microlens 250 is formed over the overcoat 240, corresponding to the photoelectric conversion area (PD). The microlens 250 is formed in a region below the photoelectric conversion area (PD).

The substrate 200 includes a semiconductor substrate. The semiconductor substrate may be a single crystal state, and it may include a material having silicon. The substrate 200 may include a material having a single crystal silicon.

The interlayer insulation layer 210 may include one or more materials selected from the group consisting of an oxide, a nitride, an oxynitride. The transistors and the metal lines formed in the interlayer insulation layer 210 may be used for implementing a signal generating circuit of the image sensor. The signal generating circuit generates or outputs electrical signals corresponding to the photocharges generated in the photoelectric conversion area (PD). The transistors may include a transfer transistor (Tx), a reset transistor (Rx), a selection transistor (Sx) and an access transistor (Ax). The multilayer metal lines may be electrically coupled to the transistors and the other metal lines through contact plugs (not shown).

The photoelectric conversion area (PD) may include a plurality of photoelectric conversion units (not shown) which are vertically overlapped. Each photoelectric conversion unit may include a photo diode having an N-type impurity region and a P-type impurity region. The photoelectric conversion area (PD) may contact both the front side and the back side of the substrate 200, and have a structure passing through the substrate 200. Also, the photoelectric conversion area (PD) may contact the front side of the substrate 200, and may be set apart from the back side of the substrate 200 by a predetermined distance.

The trench 220 formed in the photoelectric conversion area (PD) increases the photo-detecting area of the photoelectric conversion area (PD) in the limited pixel area. The photoelectric conversion area (PD) may surround the entire surfaces of the trench 220. Therefore, the photo-detecting area of the photoelectric conversion area (PD) may be increased as much as the surfaces of the trench 220—bottom surface and side surfaces of the trench 220. The incident light having various incidence angles may easily reach the photoelectric conversion area (PD) through the side surfaces of the trench 220. Therefore, a light concentrator such as the microlens 250 may not be necessary (shown in FIG. 4B). However, when the light concentrator, like the microlens 250, is implemented, the light concentration capability of the incident light and the efficiency of the photoelectric conversion may be improved (shown in FIG. 4B).

In order for the incident light having various incidence angles to easily reach the photoelectric conversion area (PD), the trench 220 may have vertical or inclined sides so that the width of the trench 220 is decreased to the direction of the incident light, e.g., from the back side to the substrate of the substrate 200. That is, the trench 220 may have the inclined sides so that the bottom width is smaller than the entrance width.

FIGS. 5A to 5F are diagrams illustrating shapes of trenches for the image sensor in accordance with an embodiment of the present invention.

Considering the direction of the incident light and the light concentration capability thereof, in order to provide a maximum photo detecting area for the photoelectric conversion area (PD), and to allow the incident light to easily reach the photoelectric conversion area (PD), the trench 220 may be a pillar-shaped polyhedron or a frustum-shaped polyhedron.

Figure 5A:
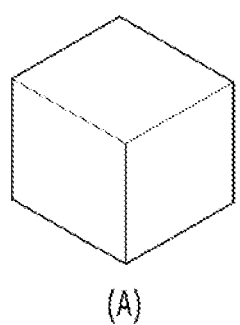
FIGS. 5A to 5F are diagrams illustrating shapes of trenches for the image sensor in accordance with an embodiment of the present invention.
Figure 5B:
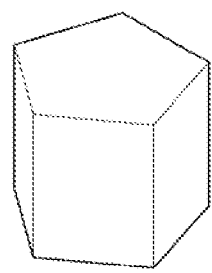
Figure 5C:
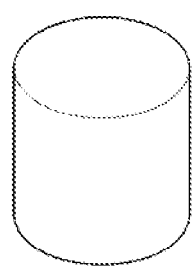
Figure 5D:
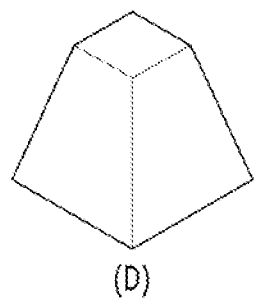
Figure 5E:
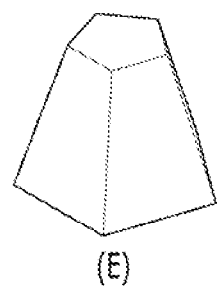
Figure 5F:
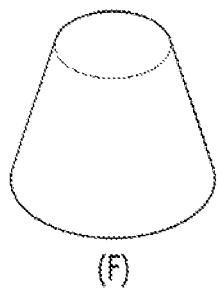

Referring to FIGS. 5A to 5F, the pillar-shaped polyhedron may include a square pillar (shown in FIG. 5A), a pentagonal pillar (shown in FIG. 5B), or a circular cylinder (shown in FIG. 5C). Likewise, the frustum-shaped polyhedron may include a square frustum (shown in FIG. 5D), a pentagonal frustum (shown in FIG. 5E), or a frustum of cone (shown in FIG. 5F). The frustum is the portion of a solid (normally a cone or pyramid) that lies between two parallel planes cutting it. Since the point at the top is removed, there is no vertex in this figure, as opposed to one vertex.

Also, the depth of the trench 220 and the entrance width of the trench 220 may be controlled by considering the absorption depth of the color separated incident light—incident light passed through the color filter 230. Specifically, as the wavelength of the color separated incident light is increased, the depth and the entrance width of the trench 220 may be decreased. For example, when the substrate 200 is a silicon substrate, the depth and the entrance width of a trench formed in a pixel, where a blue incident light is absorbed, may be smaller than that of a trench formed in a pixel, where a red incident light is absorbed. This is because the blue incident light is absorbed at a surface region of the substrate 200, and the red incident light is absorbed in a deeper area than the surface region of the substrate 200. By controlling the depth and the entrance width of the trench 200 based on the wavelength of the color separated incident light, the color separated incident light may be absorbed in a sufficient space, and the photocharges operating as noise may be generated in a minimal space.

Since the entrance of the trench 220, which is formed in the photoelectric conversion area (PD), is located on the back side of the substrate 200, side all profile, the entrance width and the shapes of the trench 220 may be easily controlled. Also, regardless of the signal generating circuit of the image sensor formed on the front side of the substrate 200, a sufficient photo-detecting area of the photoelectric conversion area (PD) may be provided in a limited pixel area.

According to the image sensor having the above described structure, a trench 220 is formed in a photoelectric conversion area, and the depth and the entrance width of the trench are controlled based on the wavelength of the color separated incident light, and thus, the light sensitivity may be improved by increasing the photo-detecting area of the photoelectric conversion area even though the pixel area is reduced. Also, a signal to noise ratio (SNR) of the image sensor may be decreased by preventing the generation of the photocharges operating as noise.

FIGS. 6A to 6D are cross-sectional views illustrating a method for fabricating the image sensor in accordance with an embodiment of the present invention. FIGS. 6A to 6D illustrate a method for fabricating the image sensor shown in FIG. 4A.

Figure 6A:
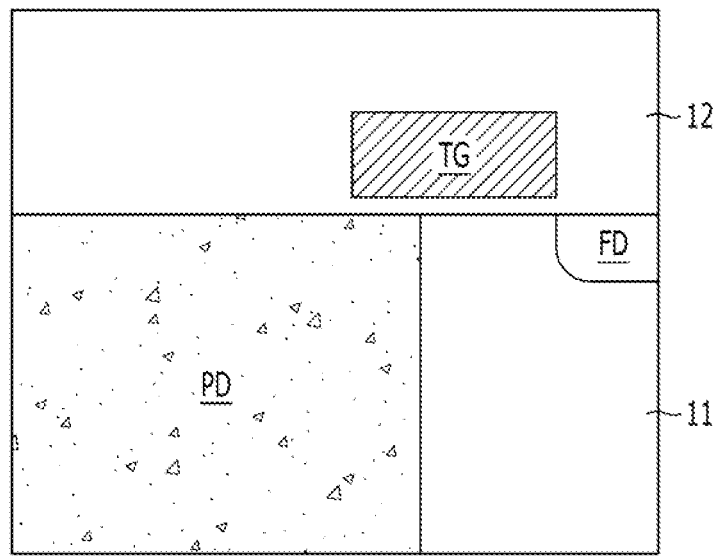
FIGS. 6A to 6D are cross-sectional views illustrating a method for fabricating the image sensor in accordance with an embodiment of the present invention.

Referring to FIG. 6A, a substrate 11 is shown, in which a plurality of pixels may be provided. The substrate 11 includes a semiconductor substrate. The semiconductor substrate may be a single crystal state, and it may include a material having silicon. The substrate 11 may include a material having a single crystal silicon.

A device isolation structure (not shown) is formed over the substrate 11 along the boundary area of the pixels. The device isolation structure may be formed by using a shallow trench isolation (STI) process or an impurity ion implantation process. The STI process is performed by forming an isolation trench in the substrate 11, and filling the isolation trench with an insulation material. The Impurity ion implantation process is performed by implanting or injecting the impurities into a predetermined region of the substrate 11. Also, the device isolation structure may be formed by using both the STI process and the impurity ion implantation process.

A photoelectric conversion area (PD) is formed in the substrate 11. The photoelectric conversion area (PD) may include a plurality of photoelectric conversion units (not shown), which are vertically overlapped. Each photoelectric conversion unit may include a photo diode having an N-type impurity region and a P-type impurity region. The photo diode is formed by performing an impurity ion implantation process.

An interlayer insulation layer 12 including a signal generating circuit is formed over the substrate 11. The interlayer insulation layer 12 may include one or more materials selected from the group consisting of an oxide, a nitride, and an oxynitride. The interlayer insulation layer 12 may include multiple layers. The signal generating circuit generates or outputs electrical signals corresponding to the photocharges generated in the photoelectric conversion area (PD). Specifically, the signal generating circuit includes a plurality of transistors (not shown) and multilayer metal lines (not shown). The transistors may include a transfer transistor (Tx), a reset transistor (Rx), a selection transistor (Sx) and an access transistor (Ax). The multilayer metal lines may be electrically coupled to the transistors and the other metal lines through contact plugs (not shown).

Figure 6B:
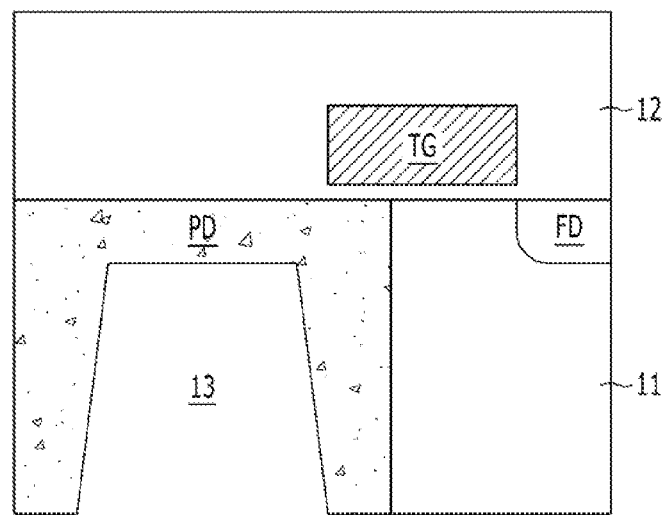

Referring to FIG. 6B, a portion of the photoelectric conversion area (PD) in the substrate 11 is selectively etched to form a trench 13 so that its entrance is located on the back side of the substrate 11. The trench 13 is formed by performing an etch process, which, may include a dry etch process.

By forming the trench 13, the photo-detecting area of the photoelectric conversion area (PD) is increased in the limited pixel area, and thus the light sensitivity may be increased. Also, the generation of the photocharges operating as noise in the photoelectric conversion area (PD) is prevented by the trench 13, and thus a signal to noise ratio may be reduced. For a better illustration of the depth, entrance widths, and shapes of the trench 13, refer to FIGS. 4A, 4B and 5A-5F.

Before forming the trench 13, a thinning process may be performed on the back side of the substrate 11 to reduce the thickness of the substrate 11. An arrival distance of the incident light reaching into the photoelectric conversion area (PD) is decreased, and the photo-detecting efficiency may be improved. The photoelectric conversion area (PD) may have a structure passing through the substrate 11 by performing the thinning process. The thinning process may include back grinding and polishing.

Figure 6C:
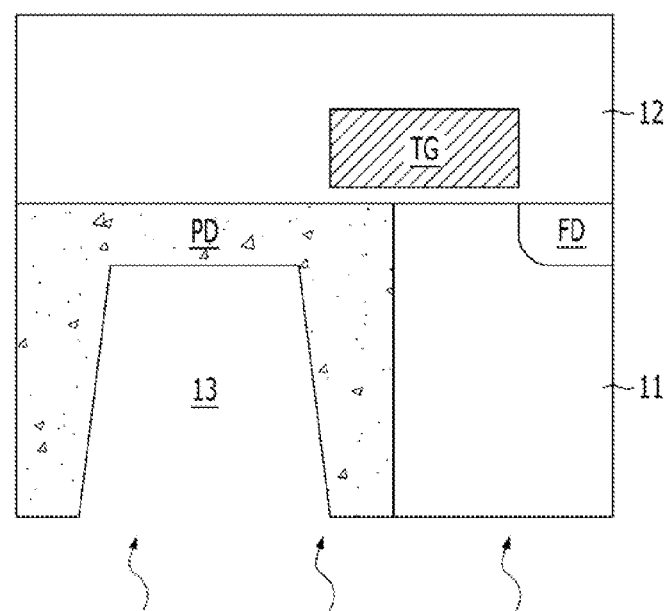

Referring to FIG. 6C, curing is performed to cure defects on the back side of the substrate 11 that occur during forming of the trench 13. The curing includes an annealing process. The annealing process may include laser annealing or UV annealing.

Before performing the curing, an impurity region (not shown) may be formed along the back side of the substrate 11 having the trench 13 by implanting ions to reduce dark current of the image sensor. After performing the curing, a material layer (not shown) having fixed charges or a transparent electrode may be formed along the back side of the substrate 11 having the trench 13, to reduce dark current of the image sensor. The material layer having fixed charges may include a hafnium oxide layer ($HfO_2$). The transparent electrode may receive a predetermined bias.

Figure 6D:
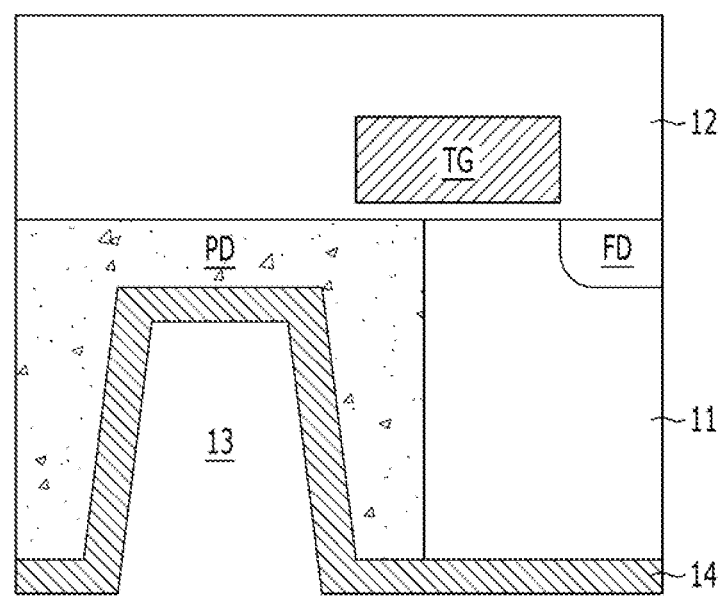

Referring to FIG. 6D, a color filter 14 is formed on the back side of the substrate 11 having the trench 13. After forming the color filter 14, an overcoat (not shown) and a microlens (not shown) may be formed over the color filter 14.

According to the image sensor formed by the above described fabrication method, a trench is formed in a photoelectric conversion area, and the depth and the entrance width of the trench are controlled based on the wavelength of the color separated incident light, and thus the light sensitivity may be improved by increasing the photo-detecting area of the photoelectric conversion area even though the pixel area is reduced. Also, a signal to noise ratio (SNR) of the image sensor may be decreased by preventing generation of the photocharges operating as noise.

Figure 7:
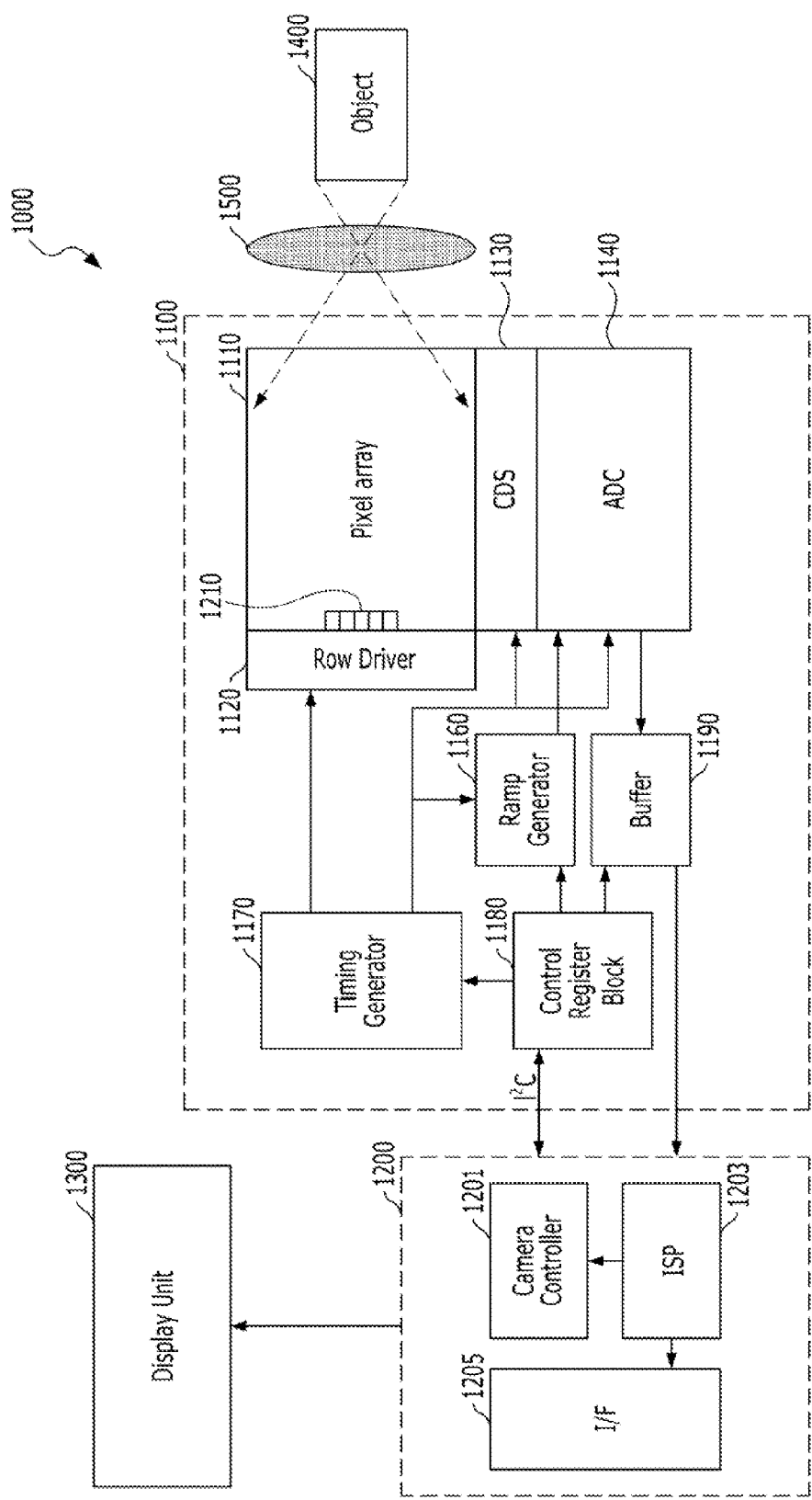
FIG. 7 is a diagram illustrating an image processing system including a pixel array in accordance with an embodiment of the present invention.

FIG. 7 is a diagram illustrating an image processing system including a pixel array in accordance with an embodiment of the present invention.

Referring to FIG. 7, the image processing system 1000 includes an image sensor 1100, a digital signal processor (DSP) 1200, a display unit 1300, and a lens module 1500.

The image sensor 1100 includes a pixel array 1110, a row driver 1120, a correlated double sampling (CDS) block 1130, an analog digital converter (ADC) block 1140, a ramp generator 1160, a timing generator 1170, a control register block 1180, and a buffer 1190.

The image sensor 1100 detects an optical image of an object 1400 through the lens module 1500 under the control of the DSP 1200. The DSP 1200 outputs the image detected and outputted by the image sensor 1100 to the display unit 1300. The display unit 1300 displays the image outputted from the DSP 1200. The display unit 1300 may include a computer, mobile communication devices, and terminals of video output devices.

The DSP 1200 may include a camera controller 1201, an image signal processor (ISP) 1203, and an interface (I/F) 1205.

The camera controller 1201 controls operations of the control register block 1180 of the image sensor 1100 by using $I^2C$ (inter-integrated circuit).

The ISP 1203 receives images or image data, processes or treats the received images, and outputs processed or treated image to the display unit 1300 through the I/F 1205. In FIG. 7, the ISP 1203 is illustrated in the DSP 1200, but the ISP 1203 may be located in the image sensor 1100. Also, the image sensor 1100 and the ISP 1203 may be implemented as one integral unit. The image sensor 1100 and the ISP 120e may be implemented as a multi-chip package (MCP).

The pixel array 1110 may include a plurality of unit pixel groups 1210 arranged in 2-dimension. Each unit pixel group may include a plurality of pixels. The unit pixel group may include a plurality of visible light pixels, or the unit pixel group may include a plurality of visible light pixels and one or more non-visible light pixels. The unit pixel group 1210 may include three pixels having a red pixel, a green pixel and a blue pixel. Also, the unit pixel group 1210 may include four pixels having a red pixel, a blue pixel and two green pixels. Also, the unit pixel group 1210 may include four pixels having a red pixel, a green pixel, a blue pixel and the non-visible light pixel. The non-visible light pixel may include one or more pixels selected from the group consisting of a white pixel, a black pixel, and an infrared pixel.

Figure 8A:
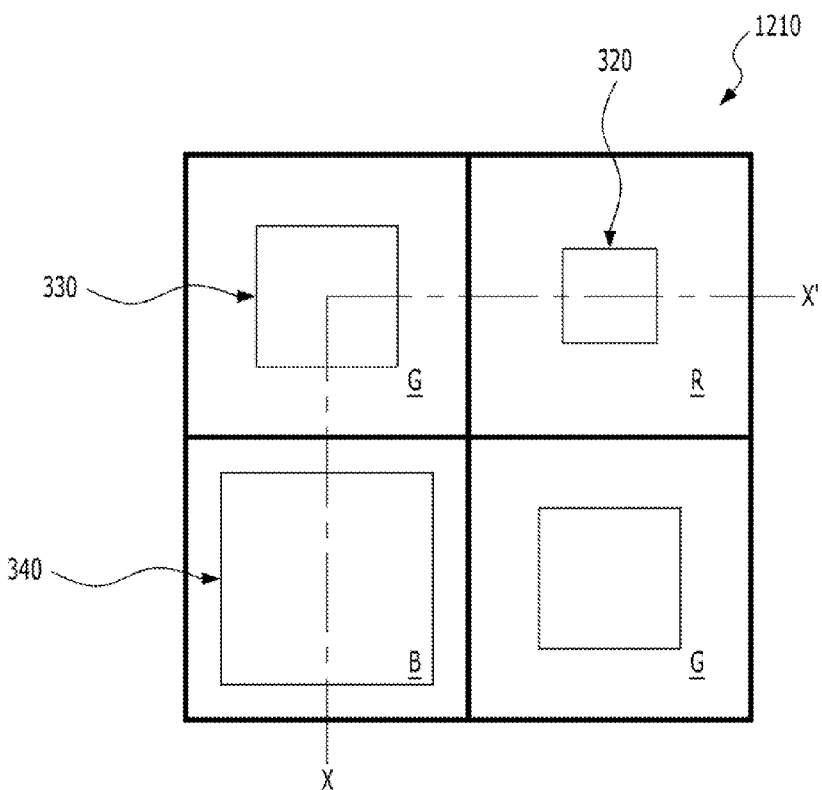
Figure 8B:
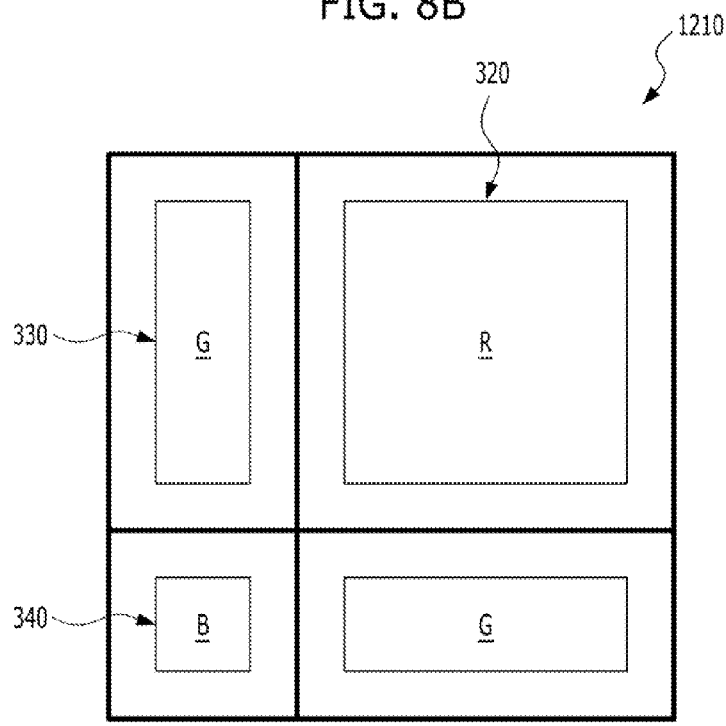

In FIGS. 8A to 8C, it is assumed that the unit pixel group 1210 has the plurality of visible light pixels. For example, the unit pixel group 1210 may have four pixels including a red pixel, a blue pixel, and two green pixels.

FIGS. 8A to 8C are diagrams illustrating a unit pixel group included in the pixel array of the image sensor in FIG. 7, in accordance with a first embodiment of the present invention. FIG. 8A is a plan view of the unit pixel group, FIG. 8B is another plan view of the unit pixel group, and FIG. 8C is a cross-sectional view of the unit pixel group taken along line X-X' of the unit pixel group of FIG. 8A.

Referring to FIGS. 8A and 8B, the unit pixel group 1210 includes a first pixel a second pixel and a third pixel. The first pixel corresponds to a visible light having a first wavelength band. The second pixel corresponds to a visible light having a second wavelength band smaller than the first wavelength band. The third pixel corresponds to a visible light having a third wavelength band smaller than the second wavelength band. Each pixel receives the incident light, which is color separated through color filter 350, 360 or 370 (FIG. 8C). For example, the first pixel, the second pixel and the third pixel may be a red pixel, a green pixel and a blue pixel, respectively. The red pixel, the green pixel and the blue pixel may include a red filter 350, a green filter 360 and a blue filter 370, respectively (FIG. 8C).

Two-dimensional planar sizes of the pixels included in the unit pixel group 1210 may be the same shown in FIG. 8A, or different from each other according to the color recognition capability of users (human) and the efficiency of the photoelectric conversion shown in FIG. 8B. When the planar sizes of the pixels are the same, productivity may be improved by reducing the difficulty in manufacturing. When the planar sizes of pixels are different from each other, light sensitivity of the image sensor may be improved. However, when the planar sizes of the pixels are different, shapes of the microlens 390 corresponding to the pixels, are different from each other, and thus, the productivity is decreased due to a sharp increase in the manufacturing difficulty. According to an embodiment of the present invention, the microlens 390 for concentrating the light is not necessary due to a trench (320, 330 or 340) included in each pixel. Therefore the planar size of each pixel may be different from each other.

Even though the planar sizes of the pixels are the same in the unit pixel group 1210, photo-detecting area for each pixel may be the same or different from each other because of the trenches 320, 330 and 340, which increase the photo-detecting area of the photoelectric conversion area (PD) in the limited pixel area. That is, the photo-detecting area of each pixel in the unit pixel group 1210 may be controlled by using the number of pixels and the trenches 320, 330 and 340. For example, when the photo-detecting area of each pixel is the same in the unit pixel group 1210, a photo-detecting area R of one red pixel, a photo-detecting area B of one blue pixel, and a photo-detecting area 2G of two green pixels may be the same. That is R, B and 2G are equal. On the other hand, when the photo-detecting area of each pixel is different from each other in the unit pixel group 1210, the photo-detecting area 2G of two green pixels may be the largest, while the photo-detecting area B of one blue pixel may be the smallest. That is, 2G is larger than R, and R is larger than B. The reason the photo-detecting area of each pixel is different from each other in the unit pixel group 1210, is to improve the light sensitivity of the image sensor by considering color recognition capability of the users, and the efficiency of the photoelectric conversion.

The unit pixel group 1210 includes a substrate 300, an interlayer insulation layer 310, a photoelectric conversion area (PD), trenches 320, 330 and 340, and color filters 350, 360 and 370. The unit pixel group 1210 further includes an overcoat 380 and the microlens 390.

The red pixel, the green pixel and the blue pixel are defined in the substrate 300. The interlayer insulation layer 310 is formed over the substrate 300, and a plurality of transistors (not shown) and multilayer metal lines (not shown) are formed therein. The photoelectric conversion area (PD) is formed in the substrate 300 corresponding to each pixel. The trenches 320, 330 and 340 are formed in the corresponding photoelectric conversion area (PD), and the entrances of the trenches are located on the back side of the substrate 300. The color filters 350, 360 and 370 are formed on the back side of the substrate 300 including the trenches 320, 330 and 340, respectively. A first trench 320 is formed in the red pixel, a second trench 330 is formed in the green pixel, and the third trench 340 is formed in the blue pixel.

The overcoat 380 is formed on the back side of the substrate 300, including the color filters 350, 360 and 370. The microlens 390 is formed over the overcoat 380, corresponding to the photoelectric conversion area (PD).

The substrate 300 includes a semiconductor substrate. The semiconductor substrate may be a single crystal state, and it may include a material having silicon. The substrate 300 may include a material having single crystal silicon.

The interlayer insulation layer 310 may include one or more materials selected from the group consisting of an oxide, a nitride, an oxynitride. A plurality of transistors (not shown) and the multilayer metal lines (not shown) formed in the interlayer insulation layer 310 may be used for implementing a signal generating circuit of the image sensor. The signal generating circuit generates or outputs electrical signals corresponding to the photocharges generated in the photoelectric conversion area (PD). The transistors may include a transfer transistor (Tx), a reset transistor (Rx), a selection transistor (Sx), and an access transistor (Ax). The multilayer metal lines may be electrically coupled to the transistors and the other metal lines through contact plugs (not shown).

The photoelectric conversion area (PD) may include a plurality of photoelectric conversion units (not shown), which are vertically overlapped. Each photoelectric conversion unit may include a photo diode having an N-type impurity region and a P-type impurity region. The photoelectric conversion area (PD) may contact both the front side and the back side of the substrate 300, and have a structure passing through the substrate 300. Also, the photoelectric conversion area (PD) may contact the front side of the substrate 300 and may be set apart from the back side of the substrate 300 by a predetermined distance.

The trenches 320, 330 and 340, formed in the photoelectric conversion area (PD), increase the photo-detecting area of the photoelectric conversion area (PD) in the limited area. The photoelectric conversion area (PD) may surround the entire surfaces of the trenches 320, 330 and 340. Therefore, the photo-detecting area of the photoelectric conversion area (PD) may be increased as much as the surfaces of the trenches 320, 330 and 340—bottom surface and the side surfaces of the trenches 320, 330 and 340. The incident light having various incidence angles may easily reach the photoelectric conversion area (PD) through the side surfaces of the trenches 320, 330 and 340. Therefore, a light concentrator such as the microlens 390 may not be necessary. However, when the light concentrator like the microlens 390 is implemented, the light concentration capability of the incident light and the efficiency of the photoelectric conversion may be improved.

In order for the incident light having various incidence angles to easily reach the photoelectric conversion area (PD), the trenches 320, 330 and 340 may have vertical, or inclined sides so that the width of the trenches 320, 330 and 340 is decreased to the direction of incident light, e.g., from the back side to the substrate of the substrate 200. That is, the trenches 320, 330 and 340 may have the inclined sides so that the bottom width is smaller than the entrance width.

Considering the direction of the incident light and the light concentration capability of the incident light, in order to provide the maximum photo-detecting area of the photoelectric conversion area (PD) and to allow the incident light to easily reach the photoelectric conversion area (PD), the trenches 320, 330 and 340 may be pillar-shaped polyhedron or frustum-shaped polyhedron.

Also, the depth of the trenches 320, 330 and 340 and the entrance width of the trenches 320, 330 and 340 may be controlled by considering the absorption depth of the color separated incident light—incident light passing through the color filters 350, 360 and 370. Specifically, as the wavelength of the color separated incident light is increased, the depth and the entrance width of the trenches 320, 330 and 340 may be decreased. For example, an entrance width and a depth of the first trench 320 in the red pixel are smaller than that of the second trench 330 in the green pixel, and an entrance width and a depth of the second trench 330 in the green pixel are smaller than that of the third trench 340 in the blue pixel. By controlling the depth and the entrance width of the trenches 320, 330 and 340 based on the wavelength of the color separated incident light, the color separated incident light may be absorbed in sufficient space, and the photocharges operating as noise may be generated in a minimum space.

In addition, since the entrances of the trenches 320, 330 and 340 formed in the photoelectric conversion area (PD) are located on the back side of the substrate 300, sidewall profile, the entrance width and the shapes of the trenches 320, 330 and 340 may be easily controlled. Also, regardless of the signal generating circuit in the image sensor formed on the front side of the substrate 300, a sufficient photo-detecting area of the photoelectric conversion area (PD) may be provided in the limited pixel area.

According to the image sensor having the above described structure, trenches 320, 330 and 340 are formed in a photoelectric conversion area, and the depths and the entrance widths of the trenches are controlled based on the wavelength of the color separated incident light, and thus the light sensitivity may be improved by increasing the photo-detecting area of the photoelectric conversion area, even though the pixel area is reduced. Also, a signal to noise ratio (SNR) of the image sensor may be decreased by preventing the generation of the photocharges operating as noise.

Figure 9A:
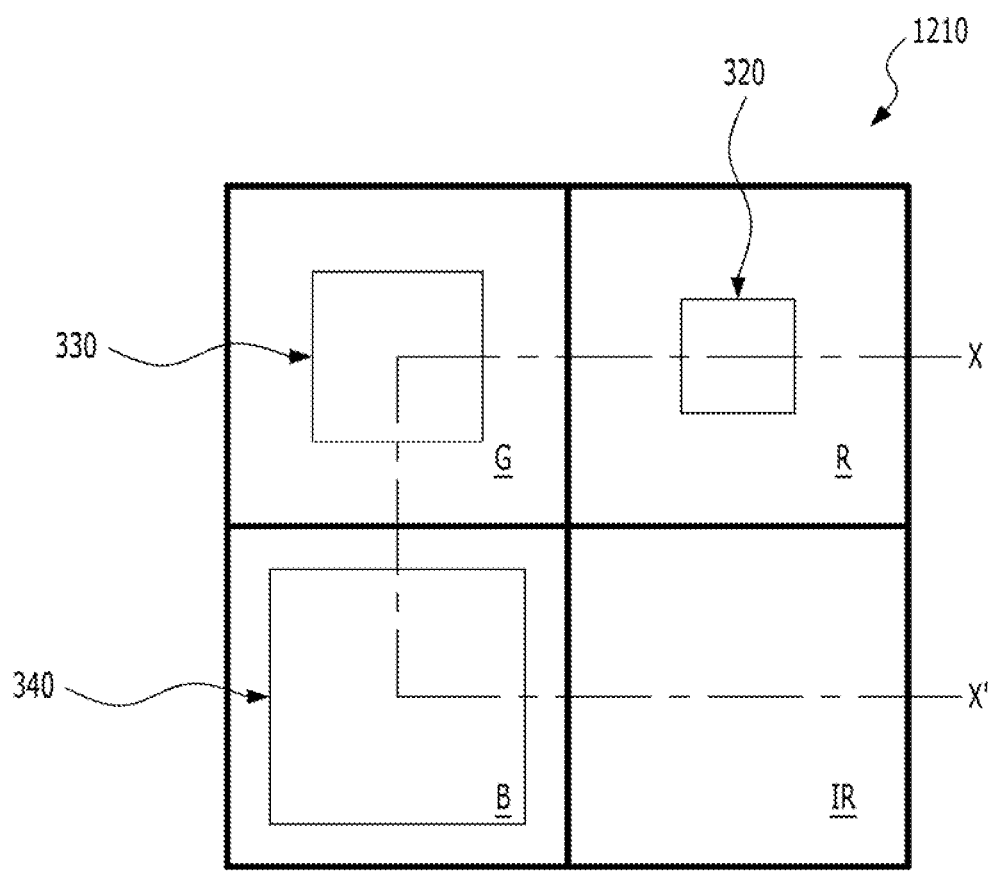
FIGS. 9A and 9B are diagrams illustrating a unit pixel group included in the pixel array of the image sensor of FIG. 7, in accordance with a second embodiment of the present invention.
Figure 9B:
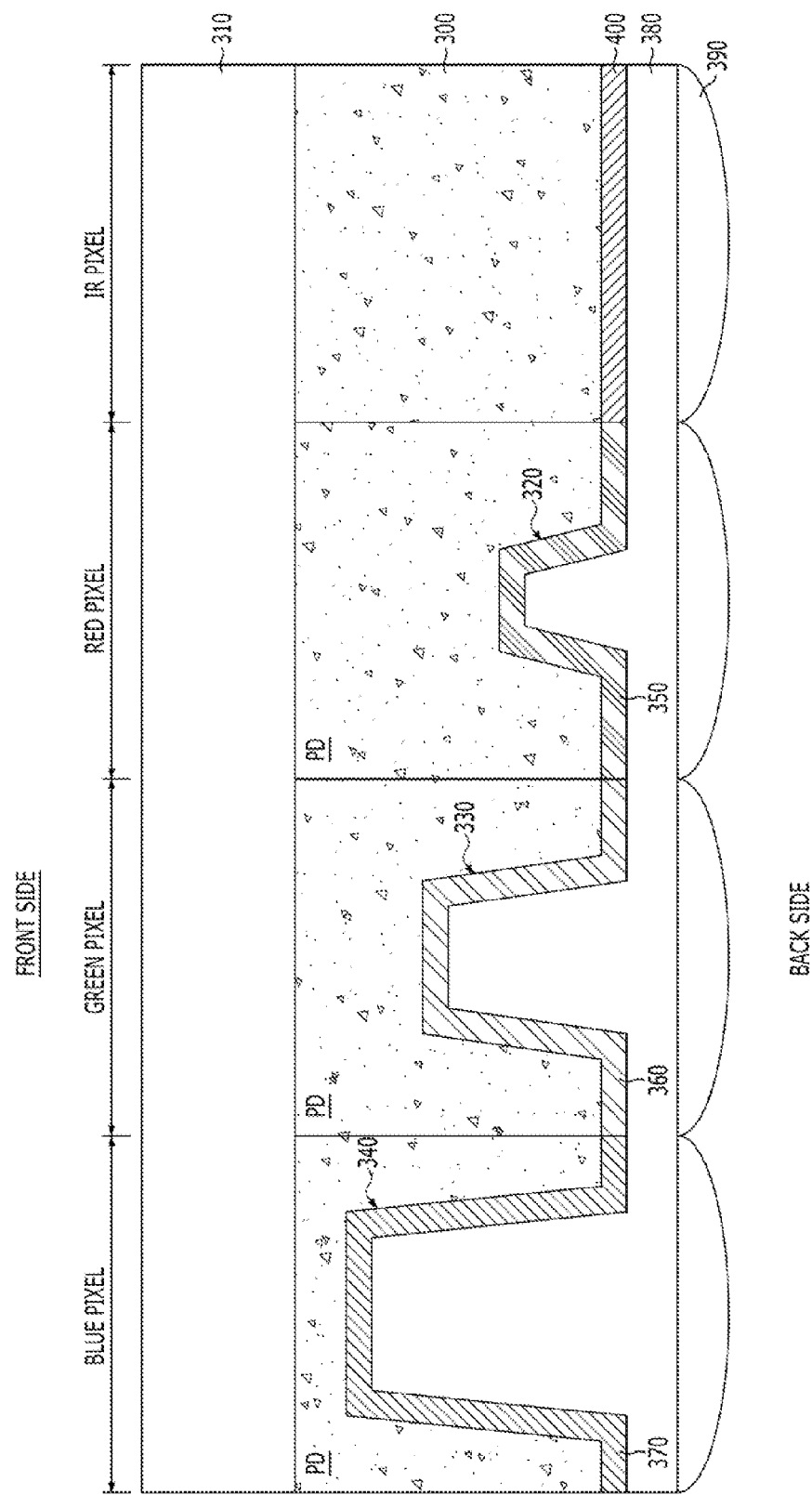

In FIGS. 9A and 9B, it is assumed that the unit pixel group 1210 has the plurality of visible light pixels and one or more non-visible light pixels. For example, the unit pixel group 1210 may have four pixels including a red pixel, a green pixel, a blue pixel and an infrared pixel.

FIGS. 9A and 96 are diagrams illustrating a unit pixel group included in the pixel array of the image sensor in FIG. 7 in accordance with a second embodiment of the present invention. Reference numerals of FIGS. 9A and 96 are the same as the reference numerals of FIGS. 8A to 8C for the same component, and detailed description is omitted.

Referring to FIGS. 9A and 9B, the unit pixel group 1210 includes a first pixel, a second pixel, a third pixel, and a fourth pixel. The first pixel corresponds to a visible light having a first wavelength band. The second pixel corresponds to a visible light having a second wavelength band smaller than the first wavelength band. The third pixel corresponds to a visible light having a third wavelength band smaller than the second wavelength band. The fourth pixel corresponds to a non-visible light. Each pixel receives the incident light having a corresponding wavelength band through color filters 350, 360 370 and 400 (FIG. 9B). For example, the first pixel, the second pixel, the third pixel, and the fourth pixel may be a red pixel, a green pixel, a blue pixel, and an infrared pixel, respectively. The red pixel, the green pixel, the blue pixel, and the infrared pixel may include a red filter 350, a green filter 360, a blue filter 370 and an infrared filter 400, respectively.

Two-dimensional planar sizes of the pixels included in the unit pixel group 1210 may be the same shown in FIG. 9A, or different from each other according to considering color recognition capability of users (human) and the efficiency of the photoelectric conversion. Even though the planar sizes of the pixels are the same in the unit pixel group 1210, the photo-detecting area for each pixel may be the same or may be different from each other because of the trenches 320, 330 and 340, which increase the photo-detecting area of the photoelectric conversion area (PD) in the limited pixel area. That is, the photo-detecting area of each pixel in the unit pixel group 1210 may be controlled by using the number of pixels and the trenches 320, 330 and 340.

The unit pixel group 1210 includes a substrate 300, an interlayer insulation layer 310, a photoelectric conversion area (PD), trenches 320, 330 and 340 and color filters 350, 360, 370 and 400. The unit pixel group 1210 further includes an overcoat 380 and a microlens 390.

The red pixel, the green pixel, the blue pixel and the infrared pixel are defined in the substrate 300. The interlayer insulation layer 310 is formed over the substrate 300, and a plurality of transistors (not shown) and multilayer metal lines (not shown) are formed therein. The photoelectric conversion area (PD) is formed in the substrate 300 corresponding to each pixel. The trenches 320, 330 and 340 are formed in the corresponding photoelectric conversion area (PD) and entrances of the trenches are located on back side of the substrate 300. The color filters 350, 360, 370 and 400 are formed on the back side of the substrate 300 including the trenches 320, 330 and 340. A first trench 320 is formed in the red pixel, a second trench 330 is formed in the green pixel, and the third trench 340 is formed in the blue pixel. The overcoat 380 is formed on the back side of the substrate 300 including the color filters 350, 360, 370 and 400. The microlens 390 is formed over the overcoat 380 corresponding to the photoelectric conversion area (PD).

The infrared pixel receives infrared light having longer wavelength than the visible light. The infrared pixel does not need a trench, because the visible light is filtered in the infrared filter 400. When the unit pixel group may have a white pixel or a black pixel instead of the infrared pixel, a trench is not needed in the white pixel or the black pixel. This is because the white pixel or the black pixel is not a pixel using a specific wavelength band such as the red pixel, a green pixel, and the blue pixel.

According to the image sensor having the above described structure, trenches 320, 330 and 340 are formed in a photoelectric conversion area, and the depths and the entrance widths of the trenches are controlled based on the wavelength of the color separated incident light, and thus the light sensitivity may be improved by increasing the photo-detecting area of the photoelectric conversion area even though the pixel area is reduced. Also, the signal to noise ratio (SNR) of the image sensor may be decreased by preventing the generation of the photocharges operating as noise.

Figure 10:
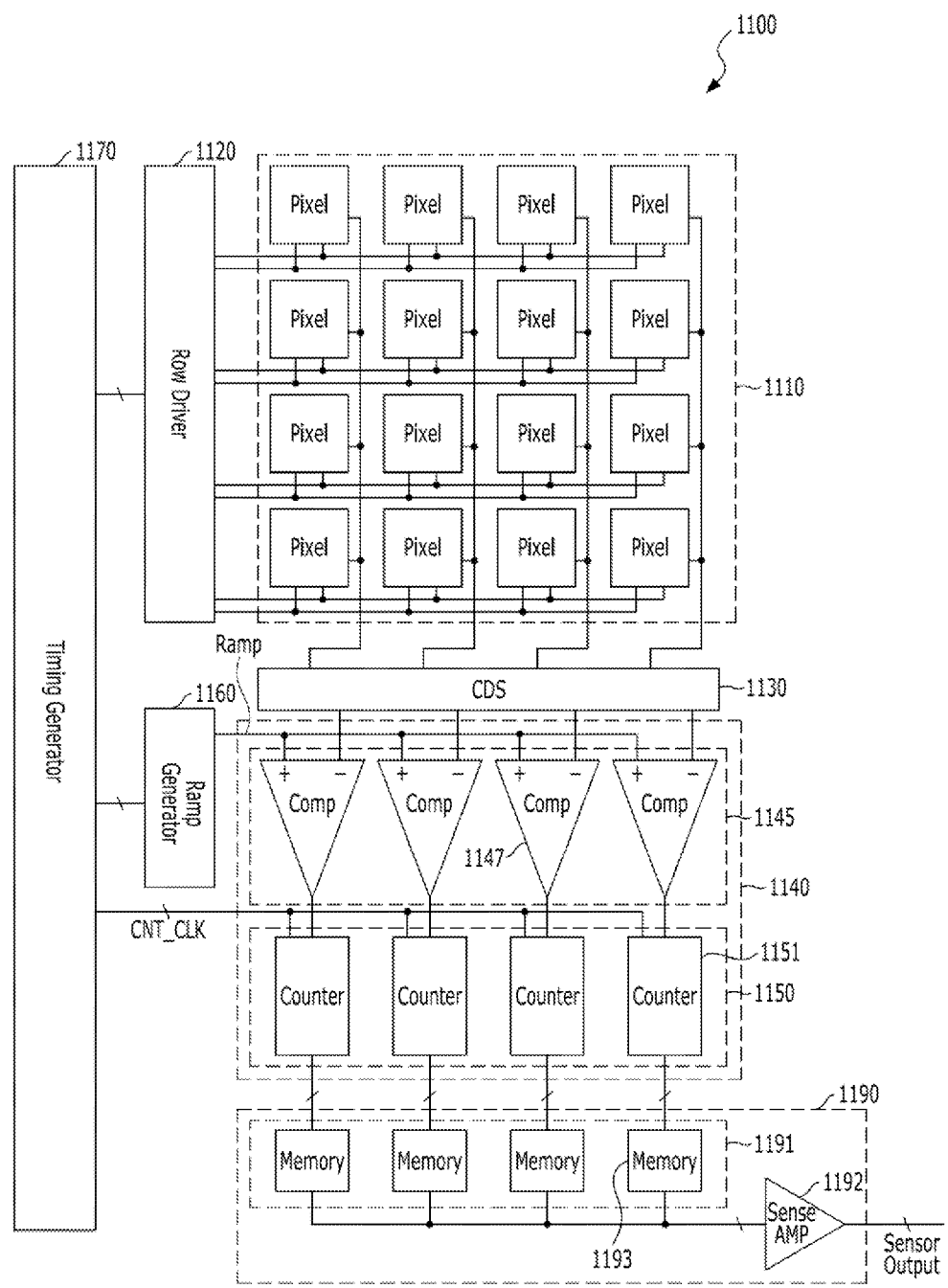
FIG. 10 is a block diagram illustrating the image sensor of FIG. 7.

FIG. 10 is a block diagram of the image sensor in FIG. 7.

Referring to FIGS. 7 and 10, a timing generator 1170 generates at least one signal for controlling the operations of a row driver 1120, a correlated double sampling (CDS) block 1130, an analog digital converter (ADC) block 1140, and a ramp generator 1160. A control register block 1180 generates at least one signal for controlling operations of the ramp generator 1160, the timing generator 1170, and a buffer 1190. The control register block 1180 operates under the control of the camera controller 1201.

The row driver 1120 drives a pixel array row by row. The row driver 1120 may generate a selection signal to select one row among a plurality of rows. Each row includes a plurality of pixels. Arrangement of the pixels shown in FIG. 10 is simply illustrated for convenience. The pixel array may include a pixel structure shown in FIGS. 4A, 4B, 8A to 8C, and 9A and 9B.

Each pixel detects the incident light and outputs an image reset signal and an image signal to the CDS block 1130. The CDS block 1130 performs a correlated double sampling to the image reset signal and the image signal. The ADC block 1140 compares a ramp signal outputted to the ramp generator 1160 with the correlated double sampled signal outputted from the CDS block 130 outputs a compare signal, counts transition time of the compare signal in response to CNT_CLK signal, and outputs a count value to the buffer 1190.

The ADC block 1140 includes a comparing block 1145 and a count block 1150. The comparing block 1145 includes a plurality of comparators. Each comparator is coupled to the CDS block 1130 and the ramp generator 1160. The signals outputted from the CDS block 1130 may be inputted into a first input terminal (negative input terminal) of the comparators, and the ramp signal outputted from the ramp generator 1160 may be inputted into a second input terminal (positive input terminal).

Each comparator receives the output signal from the CDS block 1130 and the ramp signal from the ramp generator 1160, compares and outputs the compare signal. For example, the compare signal outputted from a first comparator 1147 may be a difference between the image reset signal and the image signal varying according to illumination of the incident light.

The ramp generator 1160 may be operated under the control of the timing generator 1170. The counter block 1150 includes a plurality of counters 1151. Each counter is coupled to an output terminal of the corresponding comparator. The counter block 1150 counts transition time of the compare signal in response to CNT_CLK signal outputted from the timing generator 1170, and outputs a digital signal (count value). That is, the counter block 1150 outputs a plurality of digital image signals. Each counter 1151 may be an up/down counter or a bit-wise inversion counter.

The buffer 1190 stores the digital image signals outputted from the ADC block 1140, and sense amplified digital' image signals are outputted from the buffer 1190. The buffer 1190 includes a memory block 1191 and a sense amplifier 1192. The memory block 1191 may include a plurality of memories 1193, each storing the count value from the corresponding counter 1151. The count value is related with signals outputted from a plurality of pixels.

The sense amplifier 1192 senses and amplifies each count value outputted from the memory block 1191. The image sensor 1100 outputs image data to the DSP 1200.

Figure 11:
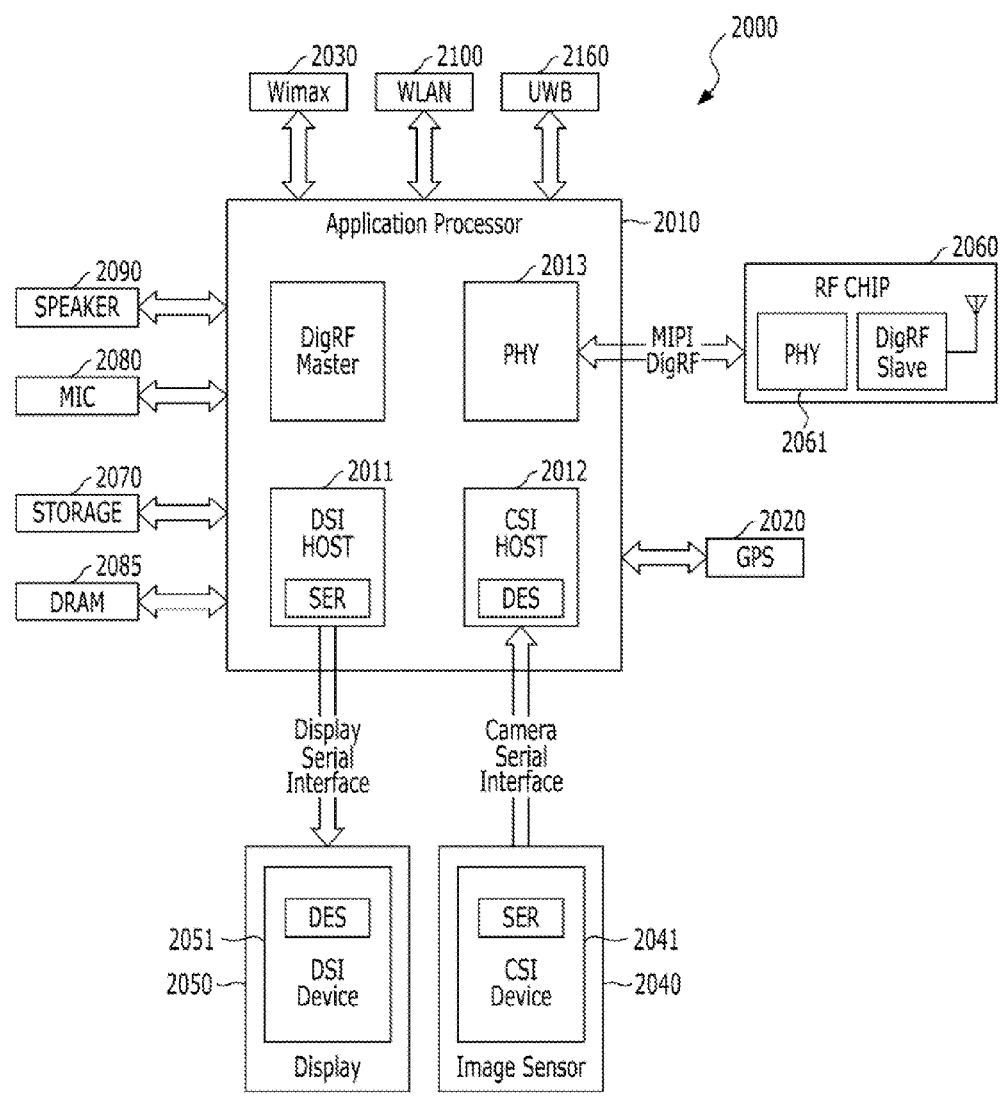
FIG. 11 is a block diagram illustrating another image processing system including the image sensor in accordance with an embodiment of the present invention.

FIG. 11 is a block diagram illustrating another image processing system including the image sensor in accordance with an embodiment of the present invention.

Referring to FIG. 11, an image processing system 2000 includes a data processing device, which may use or support mobile industry processor interface MIN. For example, the image process system may include a personal digital assistant PDA, a portable media player PMP, or mobile communication devices such as mobile phone or a smart phone. The image processing system 2000 is implemented as a portable device like a tablet computer.

The image processing system 2000 may include an application processor 2010, an image sensor 2040 and a display 2050.

A camera serial interface (CSI) host 2012 implemented in the application process 2010 may communicate in series with CSI device 2041 of the image sensor 2040 through a camera serial interface. The image sensor 2040 may include an image sensor described in the present invention. A display serial interface (DSI) host 2011 implemented in the application process 2010 may communicate in series with a DSI device 2051 of a display 2050 through a display serial interface (DSI).

The image processing system 2000 further includes a radio frequency (RF) chip 2060 communicating with an application processor 2010. A PHY 2013 of the application processor 2010 and the PHY 2061 of the RF chip 2060 may send and receive data according to MIPI DigRF.

The image processing system 2000 may further include GPS 2020, a storage 2070, a microphone 2080, a dynamic random access memory DRAM 2085, and a speaker 2090. The image processing system 2000 may communicate by using a Wimax 2030, wireless local area network WLAN 2100, or an ultra-wideband UWB 2160.

According to one embodiment of the present invention, a trench is formed in a photoelectric conversion area, and the depth and the entrance width of the trench are controlled based on the wavelength of the color separated incident light, and thus the light sensitivity may be improved by increasing the photo-detecting area of the photoelectric conversion area even though the pixel area is reduced. Also, a signal to noise ratio (SNR) of the image sensor may be decreased by preventing the generation of the photocharges operating as noise.

While the present invention has been described with respect to the specific embodiments it will be apparent to those skilled in the art that various changes and modifications may be made without departing from the spirit and scope of the invention as defined in the following claims.

What is claimed is:

1. An image sensor, comprising:
   a transfer gate formed over a front side of a substrate;
   a photoelectric conversion area formed over a back side of the substrate;
   first, second, and third trenches formed in the photoelectric conversion area; and
   first, second, and third color filters extending over the first, the second, and the third trenches, respectively,
   wherein the first, the second, and the third color filters pass light with first, second, and third wavelengths, respectively, wherein the first, the second, and the third trenches have first, second, and third widths and depths, respectively, wherein the first wavelength is greater than the second wavelength, and the second wavelength is greater than the third wavelength, and wherein the first width is narrower than the second width, and the second width is narrower than the third width.

2. The image sensor of claim 1, wherein the substrate comprises a material including silicon.

3. The image sensor of claim 1, wherein the photoelectric conversion area surrounds the first, the second, and the third trenches.

4. The image sensor of claim 1, wherein each of the first, the second, and the third trenches is a pillar-shaped polyhedron or a frustum-shaped polyhedron.

5. The image sensor of claim 1, further comprising:
an overcoat film extending over the first, the second, and the third color filters; and
a microlens formed over the overcoat film.

6. The image sensor of claim 1, wherein the light with the first wavelength is red light, and
wherein the light with the second wavelength is green light.

7. The image sensor of claim 1, wherein the light with the first wavelength is green light, and
wherein the light with the second wavelength is blue light.

8. The image sensor of claim 5,
wherein the overcoat film fills the first trench, the second trench, and the third trench.

9. The image sensor of claim 1, further comprising:
an additional photoelectric conversion area receiving non-visible light; and
an additional color filter corresponding to the non-visible light.

10. The image sensor of claim 9, wherein the light with first, second, and third wavelengths are red light, green light, and blue light, respectively.

11. The image sensor of claim 9, wherein the non-visible light is infrared light.

12. The image sensor of claim 9, wherein the photoelectric conversion area surrounds each of the first, the second, and the third trenches.

13. The image sensor of claim 9, wherein each of the first, the second, and the third trenches is a pillar-shaped polyhedron or a frustum-shaped polyhedron.

14. The image sensor of claim 9, further comprising:
an overcoat film extending over the first, the second, and the third color filters and over the additional color filter; and
a microlens formed over the overcoat film.

15. The image sensor of claim 1,
wherein the first, the second, and the third color filters are formed directly on the first, the second, and the third trenches, respectively.

16. The image sensor of claim 1,
wherein the first depth is shallower than the second depth, and the second depth is shallower than the third depth.

* * * * *